United States Patent [19]

Tanielian

[11] Patent Number: 4,465,577
[45] Date of Patent: Aug. 14, 1984

[54] METHOD AND DEVICE RELATING TO THIN-FILM CERMETS

[75] Inventor: Minas H. Tanielian, Schaumburg, Ill.

[73] Assignee: Gould, Inc., Rolling Meadows, Ill.

[21] Appl. No.: 480,935

[22] Filed: Mar. 31, 1983

[51] Int. Cl.$^3$ .............................................. C23C 15/00
[52] U.S. Cl. .................. 204/192 C; 204/192 SP; 204/192 F; 428/216; 428/469
[58] Field of Search ......... 204/192 C, 192 SP, 192 F; 428/469, 216

[56] References Cited

U.S. PATENT DOCUMENTS

| | | | |
|---|---|---|---|
| 3,074,143 | 1/1963 | Smith | 428/469 |
| 3,114,652 | 12/1963 | Schetky . | |
| 3,485,657 | 12/1969 | Beaudry et al. . | |
| 3,528,906 | 5/1970 | Cash, Jr. et al. . | |
| 3,644,188 | 2/1972 | Sharp et al. | 204/298 |
| 3,677,924 | 7/1972 | Cash, Jr. et al. . | |
| 3,879,278 | 4/1975 | Grosewald et al. | 204/192 F |
| 3,990,860 | 11/1976 | Fletcher et al. | 428/469 |
| 4,010,312 | 3/1977 | Pinch et al. | 428/469 |
| 4,043,889 | 8/1977 | Kochel . | |
| 4,071,426 | 1/1978 | Pinch et al. | 204/192 F |
| 4,076,888 | 2/1978 | Perugini et al. | 204/192 C |
| 4,234,622 | 11/1980 | DuBuske et al. . | |
| 4,298,444 | 11/1981 | Chahroudi . | |

FOREIGN PATENT DOCUMENTS 2077300 12/1981 United Kingdom .

OTHER PUBLICATIONS

Patten et al., Thin Solid Films 64 (1979) pp. 337-343.
Hanak, Proc. 6th Internl. Vacuum Congress 1974; Jap. J. Appl. Phys; Sup. 2, Pt. 1,1904 pp. 809-812.
Hollar et al., J. Electrochem. Soc. 1970, pp. 1461-1462.
Cistola et al., IBM Tech. Disc. Bull., vol. 22, No. 10, Mar. 1980, p. 4478.
"Low-Field and High-Field Hopping Conduction in Granular Metal Films" by Ping Sheng, published in American Institute of Physics, 1978.

Primary Examiner—Arthur P. Demers
Attorney, Agent, or Firm—K. H. Pierce; Edward E. Sachs

[57] ABSTRACT

The subject invention involves the provision of a cermet for providing relatively high resistivity in a relatively small space. The cermet includes a substrate and multiple, ultra-thin, alternating layers of conductive and nonconductive materials on the substrate. Each ultra-thin layer is formed by radio-frequency sputtering to produce layers of discontinuous islands of particles of each of the above materials. The invention also relates to a method of producing such cermets by radio-frequency sputtering.

18 Claims, 3 Drawing Figures

METHOD AND DEVICE RELATING TO THIN-FILM CERMETS

BACKGROUND OF THE INVENTION (A.) Field of the Invention

The present invention relates to thin-film sputter-deposition techniques to form cermets and more particularly to radio-frequency (RF) sputter deposition to form cermets having multiple, ultra-thin layers of electrically conductive and insulating materials.

(B.) Description of the Prior Art

A cermet (ceramic-metal) is an immiscible composite of an electrically conductive and an electrically insulating material. Cermet materials typically have good abrasion and corrosion resistance, they can withstand temperatures of 100°–200° C. without any significant changes in their physical properties, and their resistivity can be tailored by the proper choice of the metal/insulator ratio and the microstructure of the material. Due to the above physical characteristics, this class of materials is a suitable candidate for hybrid circuit elements where high stability and reliability is required. In the past, cermet materials have been made by sintering a mixture of a metal and an insulator powder at high temperatures. Presently, thin-film techniques have replaced some of these methods because of better accuracy in the resistivity of the material, improved reproducibility, and enhanced stability and reliability.

Thin-film techniques of making cermets include: (1) coevaporating a metal and an insulator simultaneously; (2) sputtering from a composite metal/insulator target; and (3) cosputtering from two different targets, a metal and an insulator target respectively. Each of these methods, including their respective advantages and disadvantages, will be discussed hereinbelow.

Coevaporation entails the evaporation of a metal and an insulator simultaneously, usually from two different sources. While the evaporation of a metal is a rather routine procedure, the evaporation of the insulator is not. During evaporation of insulating compounds, the compounds tend to decompose, thus resulting in poor quality control of the thin-film material.

It is well-known in the art that sputtering can be used to deposit high-quality films. Since highresistivity materials cannot be sputtered using DC methods, the following discussion will be confined to radiofrequency (RF) sputtering methods. In composite sputtering of a cermet, a single target is usually manufactured by pressing together a composite of the two components desired in a predetermined ratio. Alternatively, a piece or pieces of a first material are mechanically fixtured or imbedded in a target of a second material. An advantage of composite sputtering is that both materials can be sputtered from a single target, and the entire film may be formed in a single step. A disadvantage of composite sputtering is that it is difficult, if at all possible, to change the ratio of the conductor and insulator once the composite has been made. Therefore, one must know in advance what composition is required for the desired degree of resistivity. Thus, composite sputtering is not versatile. Furthermore, the sputtering rate of the two components in the composite target typically will be different; thus producing a film with a nominal composition which is different from that of the starting material. In addition, a composite target will often contain impurities (for instance, carbon, commonly introduced during hot-pressing) that may affect the thin film properties.

As previously noted, another method for depositing composite films involves cosputtering in which two plasmas are induced at the same time from two separate targets. Samples sit on a rotating table that passes under each target for a certain amount of time determined by the rotation speed of the table. Two major advantages of cosputtering are: (1) it is relatively versatile; and (2) the relative amounts of conductive versus insulating material can be changed by changing the power on the respective targets. Another advantage of cosputtering is that reasonably good uniformity of composition may be achieved through the film thickness. A disadvantage of the cosputtering technique is that the composition of the film produced by this method cannot be specified with great accuracy. Another disadvantage is that the grain size of each component in the film cannot be altered without changing sputtering parameters such as voltage or pressure of the sputtering gas, which will affect both targets. Another disadvantage of cosputtering is that nonlinear interactions between the two plasmas may affect the reproducibility of thin films manufactured by this method. Yet still another disadvantage of cosputtering is that one of the targets cannot be sputtered reactively (if needed) without affecting the other target.

SUMMARY OF THE INVENTION

An object of the subject development was to create a thin-film cermet using RF sputtering having a relatively high resistance, small size, and also having a temperature coefficient of resistivity close to zero over a desired temperature range in which the cermet film will be used, i.e., where the hybrid circuit will be used, where the cermet film is incorporated. The product produced by the subject development is a cermet having the characteristics described above. The subject cermet includes a substrate and multiple, ultra-thin, alternating layers of conductive and nonconductive materials on the substrate. Each ultra-thin layer is formed by radio-frequency sputtering to form alternating layers of discontinuous islands of particles from each of the above materials.

One object of the subject development is to produce a versatile method of producing thin-film cermets so that any combination of materials which may be sputtered may be used to produce a wide range of physical characteristics.

Another object of the subject development is to develop a method for producing cermets having good composition control without changing sputter deposition parameters so that it may be possible to change layer thickness of each of the materials used but keep the voltage and pressure of the sputter deposition process the same during these changes.

Another object of the subject development is to introduce a method for producing a cermet in which the grain size in each layer of the conductive and the insulative materials is controllable.

Another object of the subject development is to produce a cermet having a graded composition.

DETAILED DESCRIPTION OF THE PREFERRED EMBODIMENT

A feature of the subject development is the provision of a thin-film cermet formed of multiple ultra-thin layers of a metal and an insulator in which the layers alternate between an electrically conductive material and an electrically insulating material. Although the subject invention comprehends that the cermet may be formed of any number of layers above two layers, the preferred embodiment envisions that the number of layers actually used is in the range of ten to sixteen layers. Typically, samples made thus far of the subject cermet contain twelve layers.

The subject development comprehends that each layer is on the order of twenty to fifty angstroms thick. Each layer forms a multiplicity of discontinuous islands of the material being sputtered as opposed to a continuous film. This feature of the subject development will be discussed in greater detail herein below. The subject development further comprehends that any metal and any insulator capable of being sputtered may be used to form the cermet material depending on the sputtering parameters and the characteristics it is desired to attain in the cermet, some metals and insulators may be more useful than others.

As mentioned previously, the subject development comprehends that each layer of the subject cermet is, in reality, discontinuous islands of the material being sputtered in that layer. The distance between each island is difficult to measure; however, it is believed to be on the same order of magnitude as the layer thickness. Although the method of conduction through the cermet is not completely understood, applicant believes that the distance between each island and size of each island affects the conductor properties of the cermet. Several desirable features result from making each layer of materials by forming discontinuous islands rather than continuous films. For example, cermets made from the subject method exhibit greater stability with time at room temperature and at elevated temperatures. It is also easier to accurately produce a cermet with a desired sheet resistance. Furthermore, early tests indicate that it is possible to produce cermets with a temperature coefficient of resistivity close to zero having a broader range of resistivities when cermets are made from multiple ultra-thin layers of discontinuous islands.

Figure 1:
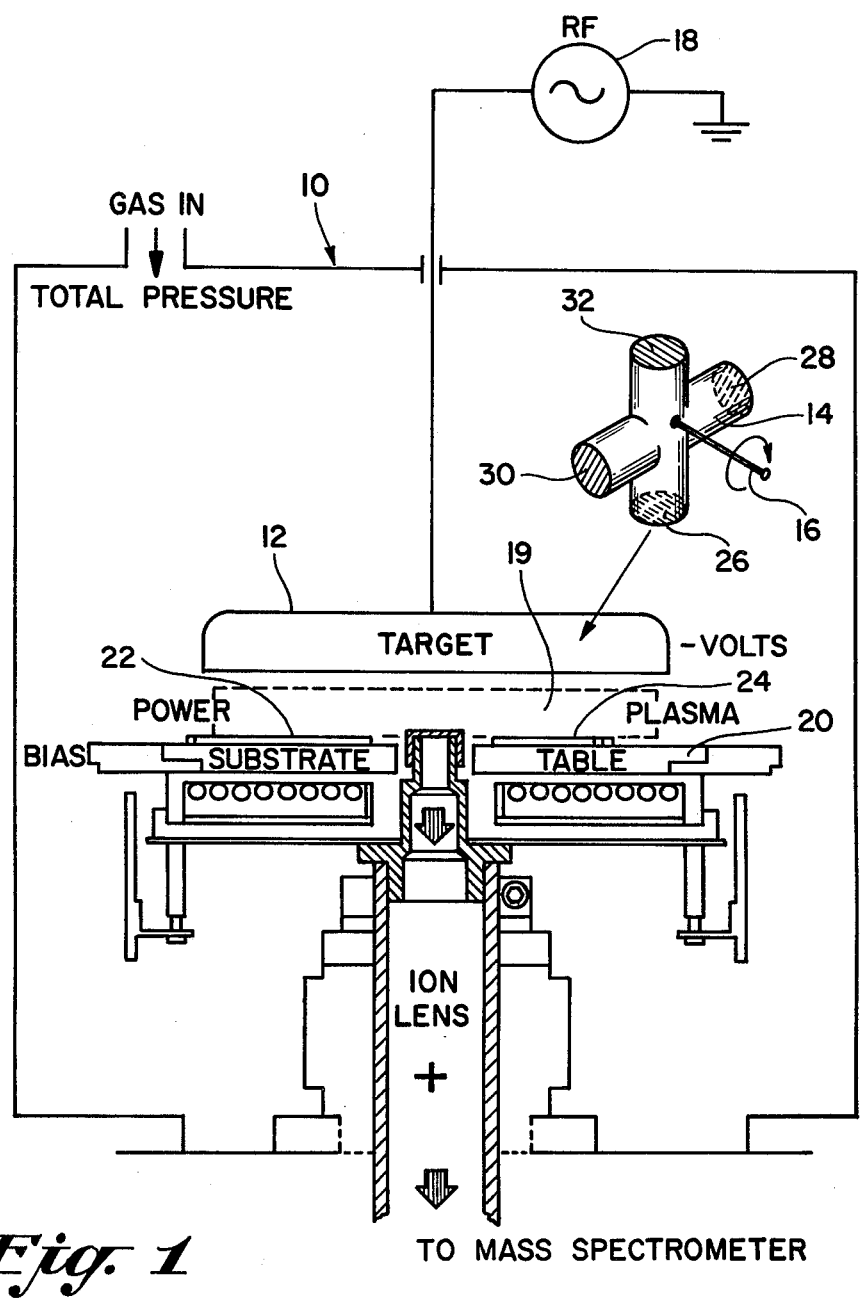
FIG. 1 is a simplified illustration of the apparatus used in the subject development to produce cermets having the desired qualities listed above.
Figure 2:
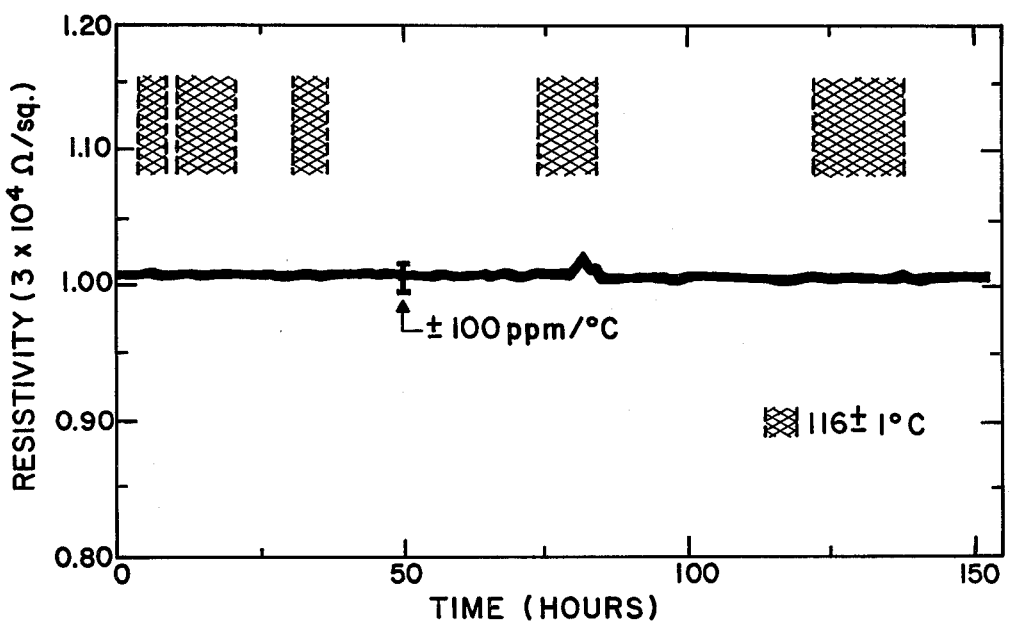
FIG. 2 is a graph which plots the resistivity of a sample of the subject cermet with respect to time and temperature.
Figure 3:
FIG. 3 is a schematic diagram of the discontinuous islands formed by the subject method to produce cermets which are the product of the subject development.

The subject development comprehends that each layer of cermet is produced by alternating targets in a single, sputter-deposition chamber. The equipment used to produce the subject cermet is not novel. It is described herein for information purposes. Refer now to FIG. 1, which illustrates a sputter deposition chamber 10. A single target 12 is shown in the figure for illustration purposes. However, for the subject development, a multiple-targeted fixture 14 is used to produce alternating layers of insulator and conductive material. The target fixture rotates about an axis 16 at intervals to produce at least four layers according to the subject invention. As can be seen in the figure, an RF singal 18 is applied to the target 12 to produce a plasma 19. A bias voltage may be applied to substrate table 20 if desired in some embodiments of the subject development to produce bias RF sputtering. According to conventional RF-sputtering techniques, the sputtering chamber 10 is pumped down to a vacuum level, on the order of $2 \times 10^{-7}$ torr. Then either an inert gas such as argon, or a mixture of an inert gas and a reactive gas, such as oxygen, is admitted into the chamber. When the RF signal 18 is applied to target 12 producing plasma 18, the plasma strikes the target 12 to cause portions of the target to be sputtered onto one or more substrates 22, 24. The substrate is typically made of silicon, silicon dioxide, or alumina ($Al_2O_3$). $Al_2O_3$ is typically used for hybrid circuits. RF sputtering is used because other methods such as evaporation and DC sputtering are unsuitable for depositing the insulating component of the cermet films.

According to the subject development, a rotatable target fixture 14 is used as previously discussed. One surface 26 of the target fixture may contain a metallic material while another surface of the target fixture 28 may contain an insulating material. Yet another surface of the target fixture 30 may contain a connector material for connecting one element of a hybrid circuit to another, while yet still another surface 32 may contain a protective coating material. In the preferred embodiment of the subject invention, the target 14 is rotated within the chamber without changing the sputtering parameters so that multiple, ultra-thin films of conductive and insulating materials may be deposited economically upon a substrate 22 or 24. While the currently preferred embodiment of the subject development comprehends that nonreactive sputtering will be used to sputter the insulating layers and the conductive layers of the cermet, one embodiment of the subject development envisions that reactive sputtering may be used for one or both of the targets. It is further comprehended that it is possible to produce a graded composition of insulating and conductive materials as a function of thickness on a substrate without changing targets.

The following examples are given for information purposes to enable one skilled in the art to easily reproduce the subject development

EXAMPLE 1

A cermet made of alternating layers of gold (Au) and silicon dioxide ($SiO_2$). Typical thickness of the gold layer will be about 50 angstroms, while the typical thickness of a silicon dioxide layer would be about 30 angstroms thick. Since sputtering tends to decompose some of the silicon dioxide molecules, reactive sputtering on the silicon dioxide target with a 20% oxygen 80% argon gas mixture is preferred. A typical embodiment has thirteen layers—six gold layers and seven $SiO_2$ layers.

EXAMPLE 2

Another example comprehends a cermet made of alternating layers of chromium (Cr) and $SiO_x$. Typical starting materials could be a chromium target and an $SiO_2$ target with twelve layers—six of each. In this case, the typical thicknesses are of 50 angstroms each, for both the insulator and the conductor layers. The films are sputtered in pure Au because excess Si atoms tend to bind to Cr atoms forming chromium silicides whose presence increases the resistivity of the films while preserving the low temperature coefficient of the resistivity.

EXAMPLE 3

A third example comprehends a cermet made of alternating layers of Au and tantalum pentoxide ($Ta_2O_5$). Typical starting materials will be a Au target and a $Ta_2O_5$ target. Thicknesses will be about 50 angstroms Au, 50 angstroms $Ta_2O_5$—ten layers of each. $Ta_2O_5$ will be sputtered in a 5% $O_2$/95% Ar atmosphere with a heated substrate at about 200° C.

In all cases, the substrates used are glazed alumina substrates.

I claim:

1. A cermet for providing relatively high resistivity in a relatively small space, comprising:
    a substrate; and
    multiple, ultra-thin, alternating layers of conductive and nonconductive materials on said substrate, each ultra-thin layer having discontinuous islands of particles of each of the above materials.

2. A cermet for providing relatively high resistivity in a relatively small space, as recited in claim 1, wherein:
    said multiple ultra-thin, alternating layers includes two layers of each of said conductive and nonconductive material.

3. A cermet for providing relatively high resistivity in a relatively small space as recited in claim 1, wherein:
    said multiple layers includes from five to ten layers of each of said conductive and nonconductive material.

4. A cermet for providing relatively high resistivity in a relatively small space as recited in claim 3, wherein:
    each of said layers is in the range of 20 to 50 angstroms thick.

5. A cermet for providing relatively high resistivity in a relatively small space as recited in claim 1, wherein:
    said multiple layers includes at least eleven layers each of said conductive and nonconductive material.

6. A cermet for providing relatively high resistivity in a relatively small space as recited in claim 1, wherein:
    each of said layers is in the range of 20 to 50 angstroms thick.

7. A cermet for providing relatively high resistivity in a relatively small space as recited in claim 1 wherein:
    said alternating layers are chromium (Cr) and SiOx.

8. A cermet for providing relatively high resistivity in a relatively small space as recited in claim 3 wherein:
    said alternating layers are gold (Au) and tantalum pentoxide ($Ta_2O_5$).

9. A cermet for providing relatively high resistivity in a relatively small space as recited in claim 1 wherein:
    said alternating layers are gold (Au) in the range of 50 angstroms thick and silicon dioxide ($SiO_2$) in the range of 30 angstroms thick.

10. A method of producing a cermet having multiple alternating layers of electrically conductive and electrically insulative materials on a substrate comprising the steps of:
    (a) radio-frequency sputtering an ultra-thin first layer of one of said electrically conductive and electrically insulating materials on a designated area of said substrate said first layer forming discontinuous islands of said material;
    (b) radio-frequency sputtering an ultra-thin second layer of the other of said materials in (a) in the same designated area of said substrate, said second layer forming discontinuous islands of said others of said materials in (a); and repeating steps (a) and (b) in an alternating mode
    (c) to from said multiple alternating layers.

11. The method as recited in claim 10 wherein step (c) further includes repeating steps (a) and (b) in an alternating mode to form 10 to 20 of said alternating layers.

12. The method as recited in claim 10 wherein steps (a) and (b) further include forming first and second layers on the order of 20-80 thick.

13. The method as recited in claim 10 wherein said electrically conductive material is gold.

14. The method as recited in claim 13 wherein said electrically insulating material is $SiO_2$.

15. The method recited in claim 10 wherein said electrically insulating material is reactively sputtered.

16. A cermet for providing relatively high resistivity in a relatively small space as recited in claim 1, wherein:
    the distance between each island of particles in a particular layer is on the same order of magnitude as the thickness of that layer.

17. A cermet for providing relatively high resistivity in a relatively small space as recited in claim 4, wherein:
    the distance between each island of particles in a particular layer is on the same order of magnitude as the thickness of that layer.

18. A cermet for providing relatively high resistivity in a relatively small space as recited in claim 6, wherein:
    the distance between each island of particles in a particular layer is on the same order of magnitude as the thickness of that layer.

* * * * *

UNITED STATES PATENT AND TRADEMARK OFFICE
CERTIFICATE OF CORRECTION

PATENT NO. : 4,465,577
DATED : August 14, 1984
INVENTOR(S) : Minas H. Tanielian

It is certified that error appears in the above-identified patent and that said Letters Patent are hereby corrected as shown below:

In column 6 of the claims, line 21, delete "from" and insert therefor --form--.

Signed and Sealed this

Eighth Day of January 1985

[SEAL]

Attest:

Attesting Officer

GERALD J. MOSSINGHOFF

Commissioner of Patents and Trademarks